(12) United States Patent
Rothschild

(10) Patent No.: US 9,587,293 B2
(45) Date of Patent: Mar. 7, 2017

(54) LEAD-FREE SOLDER ALLOY

(76) Inventor: Stanley R. Rothschild, Hudson, OH (US)

( * ) Notice: Subject to any disclaimer, the term of this patent is extended or adjusted under 35 U.S.C. 154(b) by 1587 days.

(21) Appl. No.: 12/205,121

(22) Filed: Sep. 5, 2008

(65) Prior Publication Data
US 2009/0008434 A1 Jan. 8, 2009

Related U.S. Application Data

(62) Division of application No. 11/247,290, filed on Oct. 11, 2005, now abandoned.

(60) Provisional application No. 60/628,007, filed on Nov. 15, 2004.

(51) Int. Cl.
C22C 13/00 (2006.01)
B23K 35/26 (2006.01)
C22C 13/02 (2006.01)
H05K 3/34 (2006.01)

(52) U.S. Cl.
CPC ............ C22C 13/00 (2013.01); B23K 35/262 (2013.01); C22C 13/02 (2013.01); H05K 3/3463 (2013.01); H05K 3/3468 (2013.01)

(58) Field of Classification Search
CPC ....... B23K 35/262; C22C 13/00; C22C 13/02; H05K 3/3463; H05K 3/3468
See application file for complete search history.

(56) References Cited

U.S. PATENT DOCUMENTS

| 4,929,423 | A |   | 5/1990  | Tucker et al.        |
|-----------|---|---|---------|----------------------|
| 5,328,660 | A |   | 7/1994  | Gonya et al.         |
| 5,368,814 | A |   | 11/1994 | Gonya et al.         |
| 5,393,489 | A |   | 2/1995  | Gonya et al.         |
| 5,411,703 | A |   | 5/1995  | Gonya et al.         |
| 5,429,689 | A |   | 7/1995  | Shangguan et al.     |
| 5,439,639 | A |   | 8/1995  | Vianco et al.        |
| 5,455,004 | A |   | 10/1995 | Slattery et al.      |
| 5,520,752 | A |   | 5/1996  | Lucey, Jr. et al.    |
| 5,527,628 | A |   | 6/1996  | Anderson et al.      |
| 5,698,160 | A |   | 12/1997 | Chen et al.          |
| 5,733,501 | A |   | 3/1998  | Takao et al.         |
| 5,759,379 | A |   | 6/1998  | Cavallotti et al.    |
| 5,762,866 | A |   | 6/1998  | Jin et al.           |
| 5,783,059 | A |   | 7/1998  | Cavallotti et al.    |
| 5,833,921 | A | * | 11/1998 | Paruchuri et al. ............ 420/589 |
| 5,985,212 | A |   | 11/1999 | Hwang et al.         |
| 6,045,604 | A |   | 4/2000  | Cavallotti et al.    |
| 6,048,629 | A |   | 4/2000  | Cavalloti et al.     |
| 6,070,788 | A |   | 6/2000  | Zakel                |
| 6,156,132 | A |   | 12/2000 | Yamashita et al.     |
| 6,176,947 | B1 |  | 1/2001  | Hwang et al.         |
| 6,180,055 | B1 |  | 1/2001  | Tetsuro              |
| 6,204,490 | B1 |  | 3/2001  | Soga et al.          |
| 6,224,690 | B1 |  | 5/2001  | Andricacos et al.    |
| 6,241,942 | B1 |  | 6/2001  | Murata et al.        |
| 6,296,722 | B1 |  | 10/2001 | Nishimura            |
| 6,313,412 | B1 |  | 11/2001 | Trumble et al.       |
| 6,319,461 | B1 |  | 11/2001 | Domi et al.          |
| 6,391,123 | B1 |  | 5/2002  | Nakamura et al.      |
| 6,402,013 | B2 |  | 6/2002  | Abe et al.           |
| 6,406,988 | B1 |  | 6/2002  | Chung                |
| 6,416,590 | B1 |  | 7/2002  | Hirata et al.        |
| 6,416,883 | B1 |  | 7/2002  | Walton               |
| 6,440,228 | B1 |  | 8/2002  | Taguchi et al.       |
| 6,488,888 | B2 |  | 12/2002 | Murata et al.        |
| 6,503,338 | B1 |  | 1/2003  | Taguchi et al.       |
| 6,554,180 | B1 |  | 4/2003  | Katoh et al.         |
| 6,582,579 | B1 |  | 6/2003  | Uzoh                 |
| 6,609,651 | B1 |  | 8/2003  | Borneman             |
| 6,635,123 | B2 |  | 10/2003 | Cavallotti et al.    |
| 6,648,210 | B1 |  | 11/2003 | Steen                |
| 6,657,124 | B2 |  | 12/2003 | Ho                   |
| 6,682,872 | B2 |  | 1/2004  | Sachdev et al.       |
| 6,751,099 | B2 |  | 6/2004  | Vrtis et al.         |
| 6,767,411 | B2 |  | 7/2004  | Yeh et al.           |
| 7,172,726 | B2 |  | 2/2007  | Ohnishi              |

FOREIGN PATENT DOCUMENTS

| CN | 1496780    |    | 5/2004  |
|----|------------|----|---------|
| EP | 1213089    | A1 | 6/2002  |
| EP | 1231015    | A1 | 8/2002  |
| JP | 2001129682 |    | 5/2001  |
| JP | 2003001482 |    | 1/2003  |
| JP | 2004122227 |    | 4/2004  |
| JP | 2004154864 |    | 6/2004  |
| JP | 2005153010 |    | 6/2005  |
| JP | 2005288544 |    | 10/2005 |

OTHER PUBLICATIONS

Than Trong, Long et al., "Lead-Free Solders with Excellent Solderability," Technical Review by Toshiba Company, vol. 61, No. 11, pp. 36-39 (2006).
English translation of Office action issued May 9, 2008 by the State Intellectual Property Office in corresponding Chinese National Phase of PCT Application No. PCT/US05/39769, Chinese Application No. 200580016491.8.
Extended European Search Report issued Jan. 2, 2008 by the European Patent Office in corresponding European Regional Phase of PCT Application No. PCT/US05/39769, European Application No. 05820786.1.
http://neasia.nikkeibp.com, "Pb-Free Solder Patent Problems Finally Resolved," Nikkei Electronics Asia, Apr. 2001, online summary (1 page).
www.aimsolder.com, "Patent Information," AIM Global Solder Supplier, 2004, pp. 1-2, at least as early as Sep. 2004.
English language abstract of JP 2001-129682.
English language abstract of JP 2004-154864.
English language abstract of JP 2005-153010.
English language abstract of JP 2005-288544.
English language abstract of CN 1496780.

(Continued)

Primary Examiner — Sikyin Ip
(74) Attorney, Agent, or Firm — Pearne & Gordon LLP

(57) ABSTRACT

A lead-free solder alloy includes a tin-copper alloy that also includes a minor amount of cobalt, which has been found to provide a shiny and reflective appearance to the solder alloy. Methods of soldering using such an alloy, as well as a solder joint including such an alloy also are disclosed.

10 Claims, No Drawings

(56) References Cited

OTHER PUBLICATIONS

International Search Report, Written Opinion and International Preliminary Report on Patentability issued in the corresponding PCT application, No. PCT/US05/39769.

Machine translation of Masaetesu, Japanese Patent Application Publication No. 2003-001482, published Jan. 8, 2003.

Machine translation of Seiji, et al, Japanese Patent Application Publication No. 2004-122227, published Apr. 22, 2004.

Human translation of paragraphs [0019] - [0022] of Masaetesu, Japanese Patent Application Publication No. 2003-001482, published Jan. 8, 2003.

* cited by examiner

LEAD-FREE SOLDER ALLOY

This application is a divisional of U.S. application Ser. No. 11/247,290, now abandoned, filed Oct. 11, 2005, which claims the benefit of U.S. provisional application Ser. No. 60/628,007 filed Nov. 15, 2004, the contents of which are incorporated herein by reference in their entirety.

BACKGROUND OF THE INVENTION

Historically, solder compounds have been tin-lead alloys. Specifically, tin-lead alloys provide a desirable combination of melting point, strength characteristics and electrical properties (including electrical conductivity), making their use a staple of the electronics industry for many decades.

However, recently concerns about the environment, human health and worker safety have begun to arise, and the industry has begun seeking replacements for conventional lead-containing solder alloys that perform the same job with comparable results. One such replacement alloy is a tin-copper alloy, which is a tin-based alloy having copper in an amount of typically about or less than 1 percent by weight. Tin-copper alloys often also include silver in an amount generally in the range of about 1 to 4 weight percent.

While these alloys have been shown to perform comparatively well or suitably (depending on the particular composition) compared to the strength and electrical properties of conventional tin-lead alloys, generally tin-copper alloys suffer from other significant disadvantages. They tend to be dull in appearance and not shiny, and the cost of silver-bearing tin-copper soldering alloys is significant.

Pure tin-lead solder alloys are generally highly reflective and shiny in appearance, and tend to appear dull, non-reflective or hazy in proportion to the concentration of impurities in the solder alloys. Therefore, historically a dull solder alloy appearance would indicate to a person of ordinary skill in the art that the alloy had been contaminated with undesirable impurities that tended to rob conventional tin-lead alloys of desirable properties. While a dull appearance in the more contemporary lead-free tin-copper alloys referred to above no longer necessarily is indicative of poor quality or undesirable impurities, nevertheless the electronics industry has expressed a strong prejudice against dull appearing solder alloys, and strongly prefers a shiny, reflective soldered surface.

BRIEF SUMMARY OF THE INVENTION

A lead-free solder alloy is provided, which has, by weight, at least 90% tin, 0.005-5% copper, and 0.005-5% cobalt.

A method also is provided including the steps of: melting a solder alloy to produce a molten alloy, contacting the molten alloy with at least one solid metal piece, and causing or permitting the molten alloy to cool and harden to thereby provide a solder joint. The solder alloy has, by weight, at least 90% tin, 0.005-5% copper, and 0.005-1% cobalt.

A solder joint also is provided. The joint includes a solidified alloy having a composition that includes, by weight, at least 90% tin, 0.005-5% copper, and about 0.005-5% cobalt.

DETAILED DESCRIPTION OF PREFERRED EMBODIMENTS OF THE INVENTION

As used herein, when a range such as 5-25 (or "5 to 25") is given, this means at least 5 and, separately and independently, not more than 25. Also, all percentages herein are weight percents unless otherwise explicitly stated.

A lead-free solder alloy contemplated herein exhibits substantial brightness and presents a shiny, highly reflective appearance, yet it contains no or substantially no lead, except for potential trace quantities of lead that may be present as an impurity in the alloy components discussed below, from conventional commercial sources for those components. The lead-free solder alloy is composed of tin as the base material, with a minor amount of copper, typically less than about 5 percent by weight, more preferably less than about 2 or 1 percent by weight, and a further minor amount of cobalt, which is present in an amount typically less than about 1 percent by weight, more preferably less than about 0.1 percent, or nominally about 0.06 percent by weight. The lead-free solder alloy can be made or optimized for either a wave soldering operation or a hot-air leveling solder operation, both of which are conventional and known in the electronics industry and the electronics soldering art. Lead-free solder alloy compositions that have been optimized for each of these conventional soldering operations are described below.

Table 1 describes a lead-free soldering composition that has been optimized for a conventional wave soldering operation. In table 1, any concentration or range of any of the alloy components can be combined with any concentration or range of any of the other alloy components to produce a lead-free soldering alloy according to the invention; it is not necessary that all concentrations or ranges for all of the alloy components be selected from the same column to produce an alloy as contemplated herein.

TABLE 1

| (Wave Solder Alloy Composition) | | | |
| --- | --- | --- | --- |
| | Weight Percent | | |
| Component | Preferred Concentration | Less Preferred Concentration | Least Preferred Concentration |
| Tin | Balance (nominally 99.5) | Balance | Balance |
| Copper | nominally 0.5 | 0.1-3 0.2-2 | 0.005-5 0.05-4 |
| Cobalt | 0.06 | 0.02-0.6 0.04-0.3 0.05-0.1 | 0.005-1 0.01-0.8 |
| Impurities | | Trace or less | |

Alternatively, the cobalt concentration can be about or less than 2, 3, 4 or 5 percent by weight in the alloy compositions described in Table 1. The preferred composition in table 1 (Wave Solder Alloy Composition) generally is prepared as a 99.5%/0.5% Sn/Cu alloy having 0.06% by weight cobalt to provide the desired solder alloy. Therefore, nominally this alloy has a composition of 99.5 weight percent Sn, 0.5 weight percent Cu and 0.06 weight percent Co, with allowance being made for inevitable or unavoidable impurities present in commercially available sources for the respective Sn, Cu and Co components. It will be understood that the exact composition of the preferred alloy from Table 1 can be 99.5% Sn, 0.44% Cu and 0.06% Co; alternatively it can be 99.44% Sn, 0.5% Cu and 0.06% Co; alternatively it can be 99.47% Sn, 0.47% Cu and 0.06% Co; alternatively it can be anything in between, and all of these are considered and understood to be embraced by nominally 99.5% tin, nominally 0.5% copper and 0.06% Co as reported in Table 1. In a further alternative, the preferred alloy in Table 1 can be made totaling 100.06 wt. %, in which case the values in the "preferred" column of Table 1 may be considered as parts-by-weight values. In this case, the cobalt concentration of the resulting alloy will be, mathematically, 0.05996% not accounting for significant figures (calculated as 0.06/100.06), or nominally 0.06%.

In the compositions for the lead-free solder alloy described in Table 1, it is desirable that the alloy contain zero or substantially zero impurities if this is commercially practical. However it is not required that the solder alloy have zero or substantially zero impurities. If present, it is desirable that impurities be limited to not more than 0.1 weight percent each, preferably collectively, of the total alloy. This is what is meant by "Trace or less" in Table 1 above.

As noted above, tin is considered to be the basic or principal component of the lead-free alloy, as it is present in the overwhelmingly largest weight percent concentration, such as at least 90, 92, 94, 95, 98 or 99 percent by weight. The tin facilitates wettability of the molten solder alloy to the metallic substrates to which it is to be adhered during a soldering operation. Tin has been shown and is known to provide good wettability to molten solders.

Copper is added to lower the melting temperature of the resulting alloy. The disclosed lead-free solder alloys of Table 1 desirably are used to solder delicate and thermally sensitive electronic components to printed circuit boards via a process known as wave soldering. Due to the thermal sensitivity of these components and of the printed circuit board, it is preferred that the melting temperature of the solder alloy be as low as possible. The melting point of pure tin is about 232° C. By the addition of nominally 0.5 weight percent copper to the alloy, the melting point of the resulting alloy is lowered several degrees, in the range of 227-230° C. Thus, the electronic components, more specifically their lead wires extending through holes in a printed circuit board, can be wave soldered from a molten solder bath that is up to about 5 degrees C. cooler than pure tin, which is advantageous to preserve the life and integrity of the delicate electronic components and the printed circuit boards, to which heat may be transferred via conduction through the lead wires as well as through radiation from the molten bath.

As evident from the "less preferred concentration" columns in Table 1, copper can be provided in other, higher or lower concentrations as well. A lower Cu concentration will result in a solder alloy having a relatively higher melting point, whereas a higher Cu concentration can result in the formation of Sn/Cu intermetallic compounds to an unsatisfactory or undesirable degree, which can detract from the quality of the resulting alloy as a good solder compound. Hence, the value of 0.05% Cu in the "preferred" column in Table 1 is considered to be a preferred or optimized copper concentration in the lead-free alloy. However, this concentration is not required and other Cu concentrations may be selected or optimized for particular wave-soldering applications based on application-specific factors.

Table 2 below is similar to Table 1, except that the preferred alloy in Table 2 has been optimized for hot air leveling solder applications as more fully explained below. As in Table 1, any concentration or range of any of the alloy components in Table 2 can be combined with any concentration or range of any of the other alloy components to produce a lead-free soldering alloy according to the invention; it is not necessary that all concentrations or ranges for all of the alloy components be selected from the same column in Table 2 to produce an alloy as contemplated herein.

TABLE 2

(Hot Air Leveling Solder Alloy Composition)

| | Weight Percent | | |
|---|---|---|---|
| Component | Preferred Concentration | Less Preferred Concentration | Least Preferred Concentration |
| Tin | Balance (nominally 99.7) | Balance 0.1-3 | Balance 0.005-5 |
| Copper | nominally 0.3 | 0.2-2 | 0.05-4 |
| Cobalt | 0.06 | 0.02-0.6 | 0.005-1 |
| | | 0.04-0.3 | 0.01-0.8 |
| | | 0.05-0.1 | |
| Impurities | | Trace or less | |

The preferred composition in table 2 (Hot Air Leveling Solder Alloy Composition) generally is prepared as a 99.7%-0.3% Sn/Cu alloy having 0.06% by weight cobalt to provide the desired alloy. Therefore, nominally this alloy has a composition of 99.7 weight percent Sn, 0.3 weight percent Cu and 0.06 weight percent Co, with allowance being made for inevitable or unavoidable impurities present in commercially available sources for the respective Sn, Cu, and Co components. Also, similarly as in the preferred alloy composition from Table 1, it will be understood that the exact composition of the preferred alloy from Table 2 can be 99.7% Sn, 0.24% Cu and 0.06% Co; alternatively it can be 99.64% Sn, 0.3% Cu and 0.06% Co; alternatively it can be 99.455% Sn, 0.455% Cu and 0.06% Co; alternatively it can be anything in between, and all of these are considered and understood to be embraced by nominally 99.7% tin, nominally 0.3% copper and 0.06% Co as reported in Table 2. Again as above, in a further alternative the preferred alloy in Table 2 can be made totaling 100.06 wt. %, in which case the values in the preferred column of Table 2 may be considered as parts-by-weight values. In this case, the cobalt concentration of the resulting alloy will be, mathematically, 0.05996% not accounting for significant figures (calculated as 0.06/100.06), or nominally 0.06%

In the compositions for the solder alloy described in Table 2, it is desirable that the alloy contain zero or substantially zero impurities if this is commercially practical. However it is not required that the solder alloy have zero or substantially zero impurities. If present, it is desirable that impurities be limited to not more than 0.1 weight percent each, preferably collectively, of the total alloy. This is what is meant by "Trace or less" in Table 2.

Tin is considered to be the basic or principal component of the alloy in Table 2, as it again is present in the overwhelmingly largest weight percent concentration, such as at least 90, 92, 94, 95, 98 or 99 percent by weight. The tin is present to facilitate wetting ability of the molten solder alloy to the metallic substrates to which it is to be adhered in use. Tin has been shown and is known to provide good wetting ability to molten solders.

Copper is again present to lower the melting temperature of the resulting alloy in Table 2. The preferred solder alloy from Table 2 is particularly suitable and is considered optimized to be used in a hot air leveling process to solder coat and protect bare copper surfaces on printed circuit boards. This protective coating prevents oxidation of the copper substrate on the printed circuit board. Due to the thermal sensitivity of the printed circuit board, it is preferred that the melting temperature of the solder alloy be as low as possible. The melting point of pure tin is about 232° C. By the addition of nominally 0.3 weight percent copper to the alloy, the melting point of the resulting alloy is lowered several degrees, in the range of 227-230° C., which may result, in part, from additional copper being leached from printed circuit boards into the molten solder bath during hot air leveling as described below. Thus, the printed circuit board can be hot air level soldered from a molten solder bath that is up to about 5 degrees C. cooler than pure tin, which is advantageous to preserve the life and integrity of the printed circuit board, to which heat is transferred when the printed circuit board is submersed in the molten solder bath.

Unlike the wave soldering process described above, the hot air leveling process results in a build-up of copper in the molten solder bath. Specifically, copper from the bare copper surfaces on the printed circuit board is leached from those surfaces and dissolves into the molten solder bath. Once the copper concentration reaches or exceeds approximately 1-2 weight percent of the solder bath, the solder protective coating dulls and presents an undesirable gritty appearance. By starting with a lower copper concentration, the useful life of the solder bath is extended. This is the reason for the reduced Cu concentration in the preferred composition of Table 2 compared to that in the preferred composition of Table 1; i.e., 0.3 weight percent compared to 0.5 weight percent copper. In addition, the presence of Co in the Sn/Cu solder alloy in Table 2 allows for more copper to be dissolved into the solder bath before affecting the performance of the solder in the bath and the resulting appearances of the protective coating being applied to the printed circuit board.

Sn/Cu alloys consisting of only tin and copper in the proportions described herein can be used to provide adequate lead-free solder for electronic soldering applications. However, the resulting solder alloy produces solder joints and coatings that are relatively dull in appearance, lackluster, and are not reflective.

It has been discovered, surprisingly and unexpectedly, that the addition of a minor amount of cobalt, e.g. less than about 1 percent by weight, to the Sn/Cu alloys as described above produces a solder alloy having substantially the same physical, electrical and chemical characteristics as the plain Sn/Cu alloy, with the exception that the alloy thus produced is very shiny and highly reflective. In fact, in comparison tests Sn/Cu/Co ternary alloys having less than about 1 weight percent Co have been observed to exhibit as good as or better relative shininess and reflectivity than the conventional lead-based Sn/Pb alloys that the contemporary Sn/Cu based alloys aim to replace. Thus, the disclosed lead-free solder alloy, containing preferably less than about 1 weight percent, preferably nominally 0.06 weight percent, cobalt in a Sn/Cu solder alloy, is suitable for electronic soldering applications, does not pose any of the substantial environmental, health or safety concerns or issues associated with lead-based solders, and importantly is nevertheless optically highly reflective and shiny, which is a desirable characteristic of solder alloys for electronics manufacturers, who are primary consumers of these alloys. Also, the Sn/Cu/Co alloys disclosed herein have been found to provide solder alloy coatings over pads and traces on printed circuit boards that are substantially more uniform in thickness, as well as having lower overall thickness, compared to conventional tin/lead alloys when used in the hot air leveling process. Initial investigations have shown the Sn/Cu/Co alloy thickness (maximum measured thickness of 270.2 micro-inches) was up to 45% percent less than that of conventional tin/lead alloy (maximum measured thickness of 486.7 micro-inches). Further the coating uniformity of the Sn/Cu/Co alloy was 33% more uniform across the hot air leveled surfaces than the conventional tin/lead alloy (a standard deviation of 49.1 micro-inches verses 65.6 micro-inches, respectively). In a preferred embodiment, when coated over pads and traces of a printed circuit board via a hot air leveling process, a lead-free alloy as described herein will produce a solder coating having a maximum thickness of 350, more preferably 320, more preferably 300, more preferably 290, more preferably 280, more preferably 275, micro-inches, with a standard deviation of not more than 60, more preferably 55, more preferably 50, micro-inches.

The disclosed ternary Sn/Cu/Co solder alloys can be made by first blending a master alloy of Sn and Co. This is done by melting the necessary quantities of Co and Sn at high temperature (1800-2000 degrees F.) for producing a master alloy of 95% weight percent Sn and 5% weight percent cobalt. The molten master alloy can then be poured into variously-sized and shaped molds to produce ingots or bars of differing weights based on the alloy's solid density once cooled and solidified. Next, a quantity of pure Sn is charged into a melting furnace and heated to approximately 700 degrees F. A sufficient amount of pure solid Cu (which has been mechanically reduced in size to facilitate dissolving into the Sn, such as e.g. uniform or nonuniform pellets, grains or powder) is next charged and dissolved into the molten Sn in the melting furnace. The resulting molten Sn/Cu is blended with a mixer to ensure all the Cu is dissolved into the Sn. Sufficient copper is dissolved in the molten tin to achieve a Sn/Cu alloy mixture of a composition so that on combining and mixing it in the desired volumetric or mass proportion with the 95%/5% Sn/Co master alloy made previously, a desired final alloy composition is achieved (such as, Sn99.5/Cu0.5/Co0.06 or Sn99.7/Cu0.3/Co0.06). Next, the necessary quantity of the 95%/5% Sn/Co master alloy is added to the molten Sn/Cu to produce the desired alloy composition. After sampling the molten bath and verifying the composition through analytical means, the alloy is allowed to cool to the desired temperature for casting into various shapes and forms in the respective molds. The exact amounts (masses) and compositions of both the master alloy and the Sn/Co alloy mentioned in this paragraph will, of course, depend on the total amount (mass) and desired composition of the final solder alloy to be prepared. The calculations to determine appropriate values for these parameters as well as modes of blending to produce a desired solder composition are well within the ability of a person having ordinary skill in the art.

It will be appreciated that various other conventional additives or additional alloying metals can be added to the present lead-free alloys to impart desirable properties. For example, the following additional elements listed in Table 3 can be added, in the listed or other suitable or conventional concentrations, to achieve the listed or other known or desirable properties, without departing from the scope of the invention.

TABLE 3

(Additives)

| Element | Preferred Concentration (wt. %) | Purpose |
|---|---|---|
| Phosphorus | 0.005-0.10 | Reduces dross |
| Silver | 0.005-5 | Lowers melting point and increases electrical conductivity |
| Antimony | 0.005-3 | Can prevent "tin pest," lower melting temperature and harden alloy |

TABLE 3-continued (Additives)

| Element | Preferred Concentration (wt. %) | Purpose |
|---|---|---|
| Indium | 0.005-5 | Lowers melting point, e.g. up to 20% |
| Bismuth | 0.005-5 | Can prevent "tin pest," and lower melting point, e.g. up to 45% |
| Zinc | 0.005-5 | Can lower melting piont, e.g. up to 10%, also tin-zinc alloys facilitate soldering to aluminum |

Other known or conventional additives can be selected and added by persons of ordinary skill in the art. However, it is preferred that any such additives will have no or negligible effect on the shininess and reflective characteristics of the alloys described above whose compositions are given, e.g., in Tables 1 and 2.

The Sn/Cu/Co solder alloys presently disclosed can be used or provided in any conventional form to carry out conventional soldering processes. For example, the described Sn/Cu/Co alloys can be provided in bars or ingots that can be melted to produce solder baths useful to practice hot air leveling and wave soldering techniques. In hot air leveling, copper pads and traces that have been previously deposited onto at least one surface of a circuit board are covered with a solder coating to protect the copper from oxidation. First, the entire circuit board, including the exposed copper surfaces of pads and traces as well as the rest of the board (e.g. fiberglass/epoxy composite for most circuit boards) is coated with a suitable hot air leveling flux. Then, the flux-coated board is contacted, such as by immersion or dipping in a solder bath, with molten solder and then removed. The flux protects the non-metallic (fiberglass/epoxy) surfaces of the board from being damaged by heat; the molten solder does not adhere to such surfaces. Conversely, the flux coated over the exposed copper surfaces activates those surfaces such that the molten solder will stick or adhere to and coat the copper surfaces. As the surface of the board is withdrawn from contact with the molten solder (such as by withdrawal of the circuit board from a molten solder bath), hot air is directed in the form of a high-pressure stream or jet at the emerging surface(s) of the circuit board as it/they emerge from the molten solder. This stream or jet generally is referred to as an air-knife, and is known in the art. The hot air impinges against the molten solder adhered to the copper surfaces while still substantially in the molten state, and levels the molten solder so that when it solidifies the result is a relatively more uniform protective solder layer over the copper pads, through-hole surfaces (if present) and traces on the circuit board. The resulting protective solder layer protects the copper pads, traces and through-hole surfaces from oxidation.

In wave soldering, a circuit board first is predrilled with a desired pattern of holes corresponding to the locations where the metallic electrical leads of various electronic components to be assembled to the board will be provided, and the inner surfaces of those holes are provided with a conductive coating, such as copper or other conductive metal. The predrilled holes are patterned to accommodate the electrical leads of the electronic components that will extend through the board. As used herein, 'predrilled' means the holes are provided in the circuit board prior to carrying out a wave soldering process. The holes can be provided via any conventional or suitable method, and need not necessarily be drilled; e.g. they can be punched, etc. The electronic components are positioned so their leads extend through the associated predrilled holes from a first surface of the board to the second surface thereof, which is opposite the first surface. Then, a solder flux is applied to the second surface, having the metallic electrical leads of the oppositely located electronic components exposed via the predrilled holes. The flux can be applied, e.g., via a conventional fluxer, which can be a foam or spray unit that coats the second surface with flux. After being coated with flux, the second surface of the circuit board is conveyed over a molten solder bath where it is contacted by the crest of a molten solder wave from that bath. The molten solder that contacts the second surface of the circuit board is caused to wick up the exposed electrical leads whose tips generally extend slightly beyond the second surface, and into the predrilled holes around those leads. On cooling, the molten solder in this space solidifies to provide an electrically conductive solder joint between the leads of the electronic components and the copper- or other conductive metal-coated interior surfaces of the predrilled holes. (The copper or other metallic coating in these holes can be provided via any conventional means, and typically is provided in the same process that provides the conductive pads and traces to at least one surface of the circuit board).

The second surface that is exposed to the molten solder wave typically has copper or other metallic pads and traces deposited thereon, and also typically has already undergone a hot air leveling process to provide a protective solder coating to those pads and traces. In this case, molten solder from the molten solder wave also contacts these protective solder coatings and melts them. However, the molten solder remains adhered to the underlying copper or other metallic surfaces. Following re-solidification, the resulting protective coatings over the pads and traces is some combination of the original hot air leveled solder and the wave solder applied from the wave soldering process. As before, the flux coating protects nonmetallic surfaces from being damaged by the molten solder wave. The flux also activates exposed metallic surfaces on the circuit board so that molten solder will stick to them and, on hardening, will form an electrically conductive solder joint between the metallic leads for the electronic components extending through the board and the associated copper or other metallic surfaces on the board.

Historically tin/lead solder has been used for both hot air leveling and wave soldering applications. As explained hereinabove, a lead-free solder alloy disclosed herein also can be used in these soldering techniques.

The solder alloys also can be provided in wire form, e.g., for conventional manual or by-hand soldering applications. Still further, the solder alloys can be provided in the form of a solder paste.

Solder pastes are preferred in certain applications because they are useful for surface mounting of electronic components onto a printed circuit board, as opposed to wave soldering techniques which require components to have lead wires extending through predrilled holes in the board. The utilization of through-hole technology results in holes being drilled in the printed circuit board, and the board going through additional processes to deposit copper on the inside of the through hole in order to provide a solderable substrate. These additional processes result in the generation of waste products requiring costly waste treatment. For this reason surface mounted components mounted via solder paste techniques have become much preferred for attaching certain types of electronic components to printed circuit boards because no holes are required. A solder paste of the present alloys can be prepared by first making the alloys as described above. Then, ingots or bars (or other solid forms) of these alloys can be transformed into powder, such as by grinding or other suitable or conventional methods. The alloy powder then can be suspended into a suitable flux to produce a solder paste. A typical solder paste will have a metal load of between 85 and 95 percent by weight, and the powder is normally composed of particles nominally 45 microns in diameter. In a preferred embodiment, a solder paste incorporating a lead-free alloy as described herein will have a metal load in the range of 50-99, more preferably 60-98, more preferably 70-97, more preferably 80-96, more preferably 85-95 weight percent. Also preferably, the lead-free solder alloy will be ground to or provided as suspended particles having a mean particle size of 15-75, more preferably 25-65, more preferably 35-55, more preferably 40-50 microns. To perform a surface mounting technique, the solder paste is applied to the circuit board with the use of a stencil in the appropriate pattern, the electronic component is then mounted, and the entire assembly is conveyed through an oven that activates the flux and melts the suspended solder powder. On cooling, the molten solder solidifies in the proper pattern to create a solder joint.

Characteristic Properties of a Lead-Free Solder Alloy

Numerous physical and electrochemical properties have been measured for a characteristic tin-copper solder alloy containing nominally 0.06 weight percent cobalt as presently disclosed. To perform the measurements, an ingot bar of an alloy comprised of, nominally, 99.7 weight percent Sn, 0.3 weight percent Cu and 0.06 weight percent Co, was sent to an independent laboratory for testing. In addition to a melting point of 227° C. and a density of 7.4 g/cm³, the following properties were measured for the Sn99.7/Cu0.3/Co0.06 solder alloy, according to the following methods.

Tension Testing

Tensile strength, yield strength, and elongation were measured as part of one continuous test. The test was performed in accordance with ASTM E8 on a Satec HVL 60 tension testing unit. The lead-free solder specimen tested was a rod measuring 3 inches long and 0.250 inches in diameter. For the purpose of elongation calculations upon completion of the test, the specimen was marked in the gauge length with ink and scribed with dividers. Elongation gauge marks were 4 times the diameter. The gauge marks for measuring elongation were approximately equidistant from the center of the length of the reduced section.

The specimen was affixed to the testing unit and stretched by gradual increase of force at a strain rate of 10 mm/min. When the sample started to lose its elasticity the load applied was noted and the yield strength in lbs/cross sectional area was determined. The specimen was further stretched with gradual force until breaking. The load at breaking also was noted and the tensile strength in lbs/cross sectional area was calculated, together with the % elongation at break based on the following formula:

$$\% \text{ Elongation} = \frac{(\text{Final Gauge Length}) - (\text{Initial Gauge Length})}{\text{Original Gauge Length}} \times 100\%$$

The following properties were measured for the Sn99.7/Cu0.3/Co0.06 alloy:
Tensile Strength=28 MPa
Yield Strength=21 MPa
Elongation-at-break=27%

Wetting Balance Test

The wetting balance of the Sn99.7/Cu0.3/Co0.06 alloy was measured using a Metronelec ST wetting balance. A series of copper test coupons were used in this test. Each of the copper test coupons consisted of a die cut 10 mm square piece, with 35 microns of plated copper on the surface, which was free from any conversion coating. The copper surfaces of the test coupons were microetched in 20% nitric acid solution and then rinsed and dried. A standard activated flux (per ANSI J-STD 003) was used to evaluate the wetting characteristics. The wetting balance test was conducted at the recommended operating temperature of 265° C. The results for this alloy were as follows:
Wetting Balance:
Max. Wetting Force=0.31 mN/mm at 265° C.
Time to Max. Wetting Force=0.25 seconds Specific Heat Capacity The specific heat of the alloy was measured by Differential Scanning Calorimetry (DSC). A specimen was removed from the original ingot sample. The specimen was then mounted in a standard aluminum specimen holder with a lid. The holder and lid were compressed around the specimen. The specimen was subjected to a precisely controlled temperature ramping profile while continuously monitoring the heat input and output. Reactions within the specimen cause changes in the heat input and output. The specimen was placed in the Differential Scanning Calorimeter and curves of Temperature vs. Heat Flow were generated. A synthetic sapphire sample with known specific heat properties was used as a reference standard. The specific heat value was then calculated at 25° C., based on the following test parameters:
Test Parameters:
Start Temperature=0° C.
Final Temperature=50° C.
Purge Gas=Nitrogen
Heating Rate=20° C./min
Specific Heat Capacity=295 J/kg·K Thermal Conductivity and Thermal Diffusivity Tests Conductivity and diffusivity tests were performed using Laser Flash Method in accordance with ASTM E1461-01. A small thin disc specimen was mounted horizontally in the test chamber and was then subjected to a high-intensity short duration thermal pulse. The energy of the pulse was absorbed on the front surface of the specimen and the resulting rear face temperature rise is measured. The temperature of the specimen was controlled by a furnace or cryostat. Thermal diffusivity values were calculated from the specimen thickness and the time required for the rear face temperature to rise and reach certain percentages of its maximum value. The thermal conductivity was calculated as the product of the thermal diffusivity, specific heat, and density of the specimen. The following properties were measured for the Sn99.7/Cu0.03/Co0.06 alloy:
Thermal Conductivity=81.75 W/m·K at 25° C.
Thermal Diffusivity=3.817×10⁻⁵ m²/s at 25° C.

Coeffiecient of Thermal Expansion

The thermal expansion coefficient of the alloy was measured in accordance with ASTM E831. A test specimen was cut from the original ingot of material, and its edges were inspected to ensure that they were smooth and burr-free. The top and bottom surfaces also were inspected to ensure they were parallel to each other. The specimen was analyzed using a Thermomechanical Analyzer (TMA). This method subjected the specimen to a precisely controlled temperature environment while continuously monitoring its expansion/ contraction behavior. The TMA fixturing consisted of a quartz specimen stage, a quartz expansion probe, and a moveable furnace. The expansion probe was lowered onto the stage and the apparatus was zeroed. The probe was raised and the specimen was centered on the stage. The probe was then lowered onto the top surface of the specimen. The TMA furnace was raised around the specimen and the temperature was set to a start point temperature. Once at temperature, the height of the specimen was recorded. The expansion was measured as the specimen was ramped through the temperature profile listed below. The coefficient of thermal expansion was calculated using the following formula:

$$\alpha = \frac{t_2 - t_1}{t_1(T_2 - T_1)}$$

where:
α=Coefficient of Thermal Expansion, mm/mm° C.
$t_1$=Thickness of specimen at temperature 1, mm
$t_2$=Thickness of specimen at temperature 2, mm
$T_1$=Temperature 1, ° C.
$T_2$=Temperature 2, ° C.

Based on the following temperature profile, the following coefficient of thermal expansion, α, was measured for the Sn99.7/Cu0.3/Co0.06 alloy herein described:

Test Parameters:
Start Temperature (Temperature 1)=15° C.
Final Temperature (Temperature 2)=205° C.
Purge Gas=Helium
Probe Force=10 mN
Scanning Rate=10° C./min
Axis=Z Coefficient of thermal expansion, α, =3.47×10⁻³ mm/mm° C. in range of 25-200° C.

Electrical Resistivity

The electrical resistivity was measured for the alloy in accordance with ASTM B193. A test sample was cut from the original sample ingot and re-cast. Dimensional measurements were then obtained at ambient laboratory conditions for the re-cast sample to determine the cross-sectional area. Test conditions were 24° C. and 50% relative humidity. Resistance values were measured using a milliohmmeter at laboratory ambient conditions in a Kelvin 4-pt measurement style. The locations for the measurements were at points spaced greater than one and a half times the cross-sectional area of the sample. After measurement, an Opti-scale was used to measure the gauge length (distance between the test probes) for the test specimen. The resistivity was then calculated using the following formula:

$$\rho_v = \frac{A \times R}{L}$$

where:
$\rho_v$=volume resistivity, μΩ-m
A=cross sectional area, cm²
L=gauge length, cm
R=measured resistance, μΩ
Electrical Resistivity=0.123 μΩ-m at 25° C.

Comparative Spreading Test

Comparison tests between the Sn99.7/Cu0.3/Co0.06 alloy and a conventional Sn63/Pb37 alloy were conducted similar to the method discussed in IPC-TM-650 for testing the activity of fluxes. (In this method, the activity levels of fluxes are determined by applying a known amount of flux and Sn63/Pb37 alloy to copper or brass coupons and then measuring the spread of the solder alloy over the face of the coupon).

Test Materials:
Pre-weighed pieces of Sn63/Pb37 and the present lead-free solder alloy, each weighing around 0.5 g.
Copper coupons (30 mm) pre-cleaned with sodium persulfate, rinsed and dried.
Fluxes of different activity levels as described below.
Hot plate.

Tests were conducted by placing two drops of flux and a piece of solder at the center of the copper coupon and then placing the entire package on the hot plate that was maintained at pre-determined temperatures. Upon reaching the set temperature the pre-weighed solder melted and spread on the copper surface. Tests were repeated with different flux samples for both types of solder (standard Sn63/Pb37 and the lead-free Sn99.7/Cu0.3/Co0.06). Tests with the standard tin-lead solder were conducted at 480° F. and tests with the lead-free solder were conducted at 520° F. The degree of spread for each sample in each test was noted, and based on these results the wetting capability the Sn99.7/Cu0.3/Co0.06 alloy compared to Sn63/Pb37 was found to be:

67% when R flux was used
100% when no clean flux was used
65% when water soluble (WS) flux was used, and
50% when a commercial HAL flux was used.

In addition, it was noted the molten Sn99.7/Cu0.3/Co0.06 solder on the copper coupons appeared very shiny and even.

Cooper Loading Capacity of Solder

A pure copper nugget of known weight was immersed in circulating molten solder (either standard Sn63/Pb37 or Sn99.7/Cu0.3/Co0.06 as presently disclosed) at a known temperature for fifteen minutes. The molten solder was maintained in the molten state using a solder pot with a circulating pump. Following the copper nugget immersion, a sample of the molten solder was analyzed via emission spectrophotometry for dissolved copper content. The procedure was repeated every 15 minutes, each time using a fresh copper nugget, until the copper concentration in the solder started to reach its saturation point. These tests were repeated at different temperatures for both, the standard 63/37 and the Sn/Cu/Co alloy and the trend of copper dissolution observed.

Since the initial concentration of copper in the fresh Sn/Cu/Co alloy was around 0.3 wt. %, the copper nuggets dissolved more slowly in the Sn/Cu/Co alloy than in the standard 63/37 alloy, which had an initial copper concentration near or substantially zero 0%. Interestingly, it was noted that the copper concentration leveled off at 0.45% in the standard 63/37 solder alloy, which contained no copper initially, compared to 0.8 to 1.2% for the Sn/Cu/Co alloy, which contained 0.3 percent copper initially. Measured data are reported below in Table 4. Both alloys were grainy and sluggish close to the saturation points.

TABLE 4

| | | Sn63/Pb37 alloy | | | | |
|---|---|---|---|---|---|---|
| Temp: | °F. | 440 | 480 | 500 | 520 | — |
| | °C. | 226 | 248 | 260 | 271 | — |
| Cu conc. (wt. %) at beginning of level off (saturation) point | | 0.21 | 0.4 | 0.44 | 0.46 | — |
| Cu dissolution rate as % increase of Cu in solder pot | | 0.001 | 0.002 | 0.0022 | 0.0023 | — |
| | | 99.7Sn/0.3Cu/0.06Co lead-free alloy | | | | |
| Temp: | °F. | 490 | 500 | 510 | 520 | 530 |
| | °C. | 254 | 260 | 265 | 271 | 276 |
| Cu conc. (wt. %) at beginning of level off (saturation) point | | 0.7 | 0.8 | 0.824 | 0.887 | 1.01 |
| Cu dissolution rate as % increase of Cu in solder pot | | 0.0014 | 0.0017 | 0.002 | 0.0021 | 0.0037 |

Although the above-described embodiments constitute preferred embodiments, it will be understood that various changes or modifications can be made thereto without departing from the spirit and the scope of the present invention as set forth in the appended claims.

What is claimed is:

1. A method of wave soldering comprising the steps of:
   a) providing a circuit board having a series of predrilled holes therethrough and a conductive copper coating on the inner surface of said predrilled holes,
   b) placing an electronic component so that metallic electrical leads thereof extend from a first surface of said circuit board, through said predrilled holes, toward a second surface thereof,
   c) applying a layer of flux over said second surface of said circuit board, and
   d) contacting said second surface of said circuit board with a wave of molten lead-free solder alloy so that molten solder alloy from said wave contacts said second surface of said circuit board, activating the flux previously coated thereon and causing lead-free molten solder alloy from said wave to wick up the exposed electrical leads from said second surface into said predrilled holes, to provide a solder joint between said leads and the conductive coating on the interior surfaces of said predrilled holes, said lead-free solder alloy consisting essentially of, by weight, 0.2-2% copper, 0.02-0.3% cobalt, and at least 98% tin.

2. A method of wave soldering comprising the steps of:
   a) providing a circuit board having a series of predrilled holes therethrough and a conductive copper coating on the inner surface of said predrilled holes,
   b) placing an electronic component so that metallic electrical leads thereof extend from a first surface of said circuit board, through said predrilled holes, toward a second surface thereof,
   c) applying a layer of flux over said second surface of said circuit board, and
   d) contacting said second surface of said circuit board with a wave of molten lead-free solder alloy so that molten solder alloy from said wave contacts said second surface of said circuit board, activating the flux previously coated thereon and causing lead-free molten solder alloy from said wave to wick up the exposed electrical leads from said second surface into said predrilled holes, to provide a solder joint between said leads and the conductive coating on the interior surfaces of said predrilled holes, said lead-free solder alloy comprising, by weight, 0.2-2% copper, 0.02-0.3% cobalt, and at least 98% tin.

3. A method according to claim 2, said metallic electrical leads extending out from said predrilled holes slightly beyond said second surface of said circuit board.

4. A method according to claim 2, said lead-free solder alloy consisting essentially of the cobalt, copper and tin constituents referred to in claim 2.

5. A method according to claim 2, said lead-free solder alloy consisting of the cobalt, copper and tin constituents referred to in claim 2 and impurities.

6. A method according to claim 2, said lead-free solder alloy comprising 0.02-0.1% cobalt.

7. A method according to claim 2, said lead-frees older alloy comprising 0.04-0.1% cobalt.

8. A method according to claim 2, said lead-free solder alloy comprising 0.05-0.1% cobalt.

9. A method according to claim 2, said lead-free solder alloy comprising 0.06% cobalt.

10. A method according to claim 2, said lead-free solder alloy comprising nominally 0.5% copper.

* * * * *

UNITED STATES PATENT AND TRADEMARK OFFICE
CERTIFICATE OF CORRECTION

PATENT NO.        : 9,587,293 B2
APPLICATION NO.   : 12/205121
DATED             : March 7, 2017
INVENTOR(S)       : Stanley R. Rothschild Page 1 of 1

It is certified that error appears in the above-identified patent and that said Letters Patent is hereby corrected as shown below:

In Column 11, Line 46, Please delete "50%" and insert therefor -- ~50% --

Signed and Sealed this
Ninth Day of May, 2017

Michelle K. Lee
*Director of the United States Patent and Trademark Office*